(12) United States Patent
Chuang et al.

(10) Patent No.: US 10,903,204 B2
(45) Date of Patent: Jan. 26, 2021

(54) LATERAL TRANSIENT VOLTAGE SUPPRESSOR DEVICE

(71) Applicant: AMAZING MICROELECTRONIC CORP., New Taipei (TW)

(72) Inventors: Che-Hao Chuang, Jhudong Township, Hsinchu County (TW); Chih-Ting Yeh, Zhudong Township, Hsinchu County (TW); Kun-Hsien Lin, Hsinchu (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 268 days.

(21) Appl. No.: 16/043,658

(22) Filed: Jul. 24, 2018

(65) Prior Publication Data

US 2020/0035665 A1 Jan. 30, 2020

(51) Int. Cl.
*H01L 27/02* (2006.01)
*H01L 29/06* (2006.01)
*H01L 29/861* (2006.01)

(52) U.S. Cl.
CPC ...... *H01L 27/0255* (2013.01); *H01L 29/0642* (2013.01); *H01L 29/861* (2013.01)

(58) Field of Classification Search
CPC ............. H01L 27/0255; H01L 29/0642; H01L 29/861; H01L 29/87; H01L 29/8611; H01L 27/0248; H01L 29/0615; H01L 29/0684
See application file for complete search history.

(56) References Cited

U.S. PATENT DOCUMENTS 6,399,990 B1 * 6/2002 Brennan ............. H01L 27/0266 257/355
8,169,000 B2 5/2012 Chuang
(Continued)

FOREIGN PATENT DOCUMENTS

CN 1901192 A 1/2007
CN 106409826 A 10/2016
(Continued)

OTHER PUBLICATIONS

Taiwanese Examination Report based on corresponding Application No. 108124990; dated Dec. 19, 2019.
(Continued)

*Primary Examiner* — Kyle J Moody
(74) *Attorney, Agent, or Firm* — Muncy, Geissler, Olds & Lowe, P C.

(57) ABSTRACT

A lateral transient voltage suppressor device is provided, comprising a doped substrate, a lateral clamping structure disposed on the doped substrate, a buried doped layer disposed between the doped substrate and the lateral clamping structure for isolation, at least one diode module, and at least one trench arranged in the doped substrate, having a depth not less than that of the buried doped layer, and being disposed between the lateral clamping structure and the at least one diode module for electrical isolation. The doped substrate and the buried doped layer have opposite conductivity types such that the doped substrate is electrically floating. The buried doped layer can be further disposed to separate the diode module from the doped substrate. By employing the proposed invention, the lateral transient voltage suppressor device is advantageous of maintaining both a lower clamping voltage as well as a reduced dynamic resistance.

10 Claims, 13 Drawing Sheets

(56) References Cited

U.S. PATENT DOCUMENTS

| | | | |
|---|---|---|---|
| 8,232,601 B1 | 7/2012 | Lin | |
| 8,513,087 B2* | 8/2013 | Disney | H01L 21/76243 |
| | | | 257/E21.375 |
| 8,785,971 B2 | 7/2014 | Chuang | |
| 10,026,728 B1* | 7/2018 | Agam | H01L 21/4857 |
| 10,373,947 B2* | 8/2019 | Mallikarjunaswamy | |
| | | | H01L 29/8611 |
| 2008/0203534 A1* | 8/2008 | Xu | H01L 27/0259 |
| | | | 257/577 |
| 2008/0290462 A1* | 11/2008 | Schmenn | H01L 29/66121 |
| | | | 257/546 |
| 2012/0012974 A1 | 1/2012 | Chuang et al. | |
| 2015/0221629 A1* | 8/2015 | Besse | H01L 27/0262 |
| | | | 257/140 |
| 2020/0058636 A1* | 2/2020 | Lin | H01L 27/0248 |
| 2020/0083212 A1* | 3/2020 | Zhao | H01L 29/0834 |

FOREIGN PATENT DOCUMENTS

| | | |
|---|---|---|
| CN | 107170738 A | 9/2017 |
| CN | 207082530 U | 3/2018 |
| TW | 200945773 A1 | 11/2009 |
| TW | 201703251 A | 1/2017 |
| TW | 201724459 A | 7/2017 |

OTHER PUBLICATIONS

Vachchenko et al., "ESD Design for Analog Circuits," Springer Science & Business Media, LLC, 2010, 9 pages.

Office Action dated Jun. 12, 2020 in Chinese Application No. 201811133499.8.

* cited by examiner

LATERAL TRANSIENT VOLTAGE SUPPRESSOR DEVICE

BACKGROUND OF THE INVENTION

Field of the Invention

The present invention relates to a lateral transient voltage suppressor device, and more particularly to a lateral transient voltage suppressor device which comprises a buried doped layer therein so as to reach a small dynamic resistance.

Description of the Prior Art

With rapid development of today's technology, integrated circuits have been widely applied in electronic devices. However, electrostatic discharge, ESD hereinafter, may occur everywhere during the phases of testing, assembly, installation, operation, etc., and cause damage to integrated circuits (ICs). Electrostatic discharge (ESD) is a phenomenon that releases and transfers charges between integrated circuit chips and external objects. Due to a large amount of charges being released in a short time, the energy from ESD is much higher than the bearing capacity of the chip, which may result in a temporary functional failure or even a permanent damage to the chip. During the process for manufacturing a chip, a wrist strap or an anti-static clothing can be used to reduce the damage from ESD. The chip having been manufactured is easily affected by ESD events between the chip and the external objects when the chip is used in various different environments. Therefore, an ESD protection device is provided in the chip to offer an electrostatic discharge path to protect the chip effectively, so that the reliability and service life of the integrated circuit chip is improved.

Figure 1:
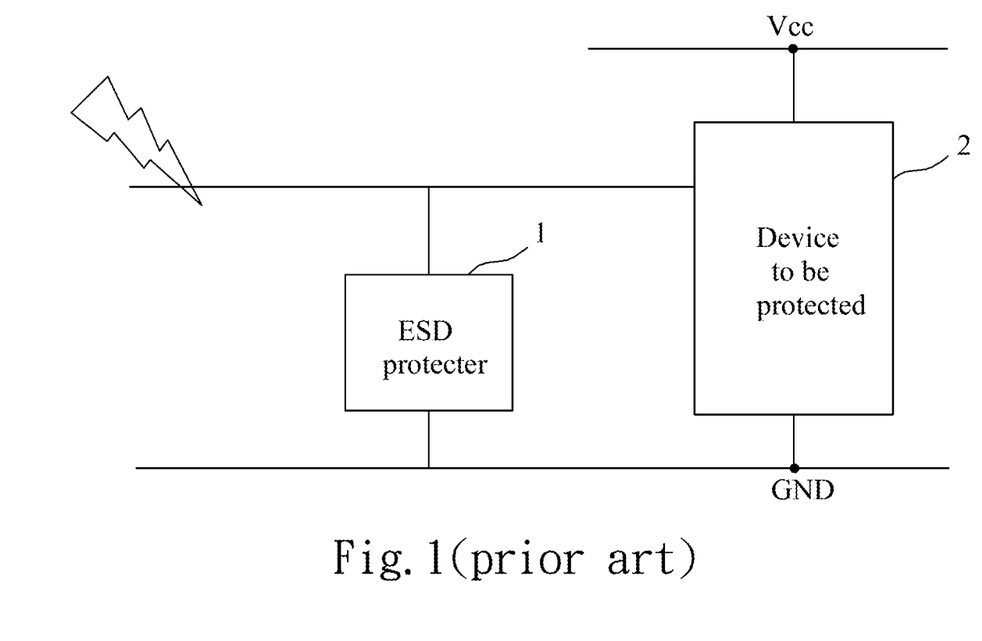
FIG. 1 shows a conventional system level ESD protection scheme in prior arts.

FIG. 1 shows a conventional ESD protection to a core circuit. As shown in FIG. 1, ESD (Electro Static Discharge) protector 1 is one of the major necessities in the field of integrated circuits for preventing the device to be protected 2 from an ESD event, and has been well known by person skilled in the art. The device to be protected 2 such as core circuits, are prone to damages caused by the ESD event. In a conventional technical field, transient voltage suppressors (TVS) are usually used to conduct an ESD protection. A plurality of disclosures have been made so far, for example, an U.S. Pat. No. 8,169,000 disclosed a lateral transient voltage suppressor with ultra low capacitance, an U.S. Pat. No. 8,232,601 disclosed a transient voltage suppressor for directional ESD protection, and an U.S. Pat. No. 8,785,971 disclosed a transient voltage suppressor without leakage current. However, regarding these prior patents, a clamping voltage thereof is still too high, though. Apart from these, the transient voltage suppressor structure proposed in U.S. Pat. Nos. 8,232,601 and 8,785,971 are merely vertical zener diodes, which show no snapback behaviors. As a result, it is believed that, there is still a lot left for improvements among these prior arts.

Therefore, on account of above, to overcome the above-mentioned problem, it should be obvious that there is indeed an urgent need for the professionals in the field for a new transient voltage suppressor device to be developed that can effectively solve those above mentioned problem occurring in the prior design.

SUMMARY OF THE INVENTION

In order to overcome the above-mentioned disadvantages, one major objective in accordance with the present invention is provided for a novel lateral transient voltage suppressor device. By employing the lateral transient voltage suppressor device of the present invention, it can be utilized so as to reach both a lower clamping voltage as well as a reduced dynamic resistance.

For achieving the above mentioned objectives, the present invention provides a lateral transient voltage suppressor device, which comprises: a doped substrate; a lateral clamping structure disposed on the doped substrate; a buried doped layer disposed between the doped substrate and the lateral clamping structure for isolation; at least one diode module which is located at one side of the lateral clamping structure; and at least one trench arranged in the doped substrate, having a depth not less than that of the buried doped layer, and being disposed between the lateral clamping structure and the at least one diode module for electrical isolation.

The doped substrate and the buried doped layer have opposite conductivity types such that the doped substrate is electrically floating. According to one embodiment of the present invention, when the doped substrate is a N type substrate, dopants of the buried doped layer belong to P type. Alternatively, according to other embodiment of the present invention, when the doped substrate is a P type substrate, dopants of the buried doped layer belong to N type.

The present invention is not limited to a certain type of lateral clamping structure. For example, the proposed lateral clamping structure can be a lateral bipolar transistor circuit, or a lateral silicon controlled rectifier circuit. Both are applicable to implement the objectives of the present invention.

Furthermore, the at least one diode module may comprise a first diode module, and the first diode module comprises a first diode and a second diode. Alternatively, the at least one diode module may further comprise a second diode module in addition, and the second diode module comprises a third diode and a fourth diode.

In order to enhance the efficiency of the present invention, according to another embodiments of the present invention, the buried doped layer is able to be further disposed below at least one of the first diode, the second diode, the third diode and the fourth diode. It is intended that the present invention cover modifications and variations of this invention provided they fall within the scope of the invention and its equivalent.

As a result, it is apparent that the present invention successfully solves the conventional problems occurring in the prior arts. Thus, a lower clamping voltage as well as a reduced dynamic resistance can be both achieved through the proposed lateral transient voltage suppressor device.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 2:
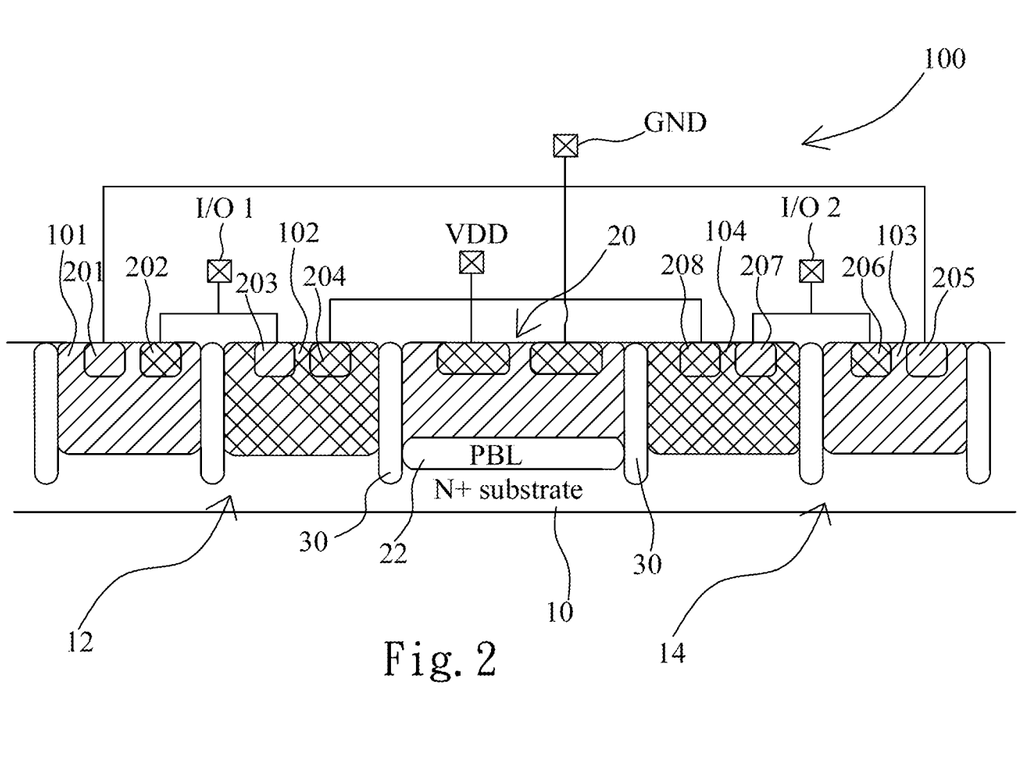
FIG. 2 shows a block diagram of a lateral transient voltage suppressor device in accordance with a first embodiment of the present invention.

The present invention discloses a novel lateral transient voltage suppressor device which can be utilized for maintaining both a lower clamping voltage as well as a reduced dynamic resistance. Please refer to FIG. 2, which shows a block diagram of a lateral transient voltage suppressor device in accordance with a first embodiment of the present invention. As shown in FIG. 2, the lateral transient voltage suppressor device 100 comprises a doped substrate 10, a lateral clamping structure which is disposed on the doped substrate 10, a buried doped layer 22 which is disposed between the doped substrate 10 and the lateral clamping structure 20, at least one trench 30 and at least one diode module which is located at one side of the lateral clamping structure 20. According to the embodiment of the present invention, the diode module may comprise a first diode module 12 and a second diode module 14. The first diode module 12 and the second diode module 14 are configured to be at opposite sides of the lateral clamping structure 20 for inputting and outputting signals, respectively. In such an embodiment, two I/O pins are employed, in which the first diode module 12 is coupled to a first input/output terminal I/O 1, and the second diode module 14 is coupled to a second input/output terminal I/O 2, respectively. Nevertheless, it is worth noticing that the present invention is not limited thereto. When a plurality of input/output terminals is employed, the diode module of the present invention may certainly further comprise more diodes and/or diode modules. In order to explain the technical contents of the present invention and let the examiner have a better understanding, we simply take two diode modules (i.e. the first diode module 12 and the second diode module 14) as exemplary embodiments for detailed illustrations in the following paragraphs.

Figure 3:
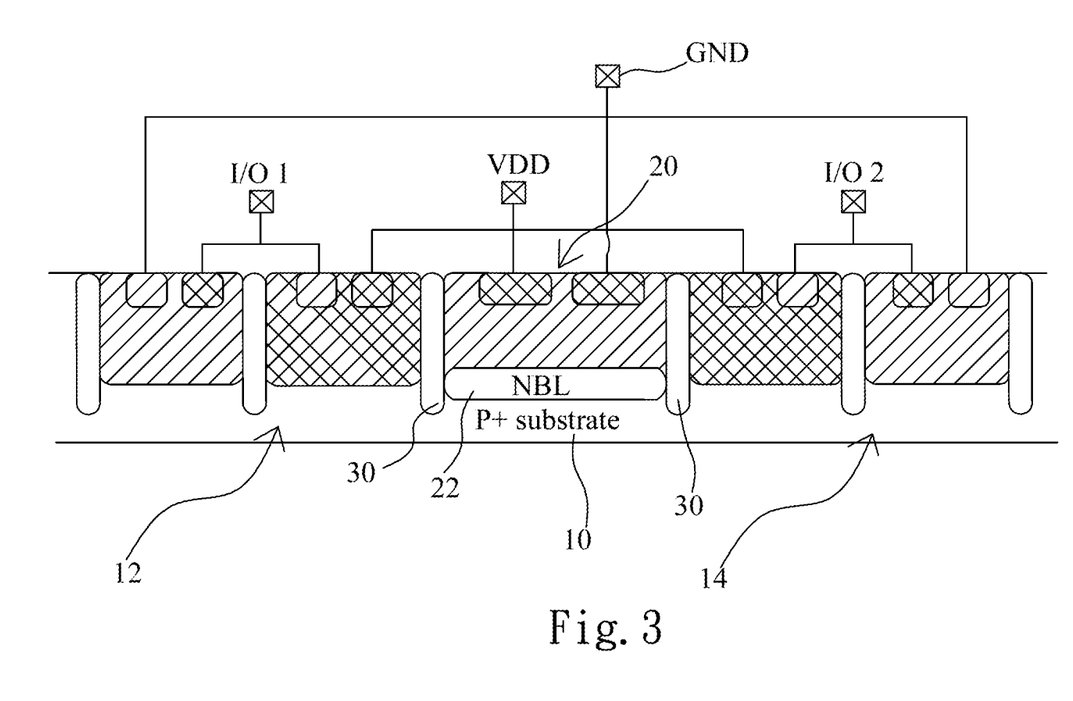
FIG. 3 shows a block diagram of a lateral transient voltage suppressor device in accordance with a second embodiment of the present invention.

According to the embodiment of the present invention, the doped substrate 10 and the buried doped layer 22 have opposite conductivity types. For example, when the doped substrate 10 is a N type substrate, dopants of the buried doped layer 22 belong to P type as shown in FIG. 2. As such, the doped substrate 10 is a N+ substrate, and the buried doped layer 22 is a P type buried layer (hereinafter PBL). FIG. 3 shows a block diagram of a lateral transient voltage suppressor device in accordance with a second embodiment of the present invention. As shown in FIG. 3, when the doped substrate 10 is a P type substrate, shown as a P+ substrate, dopants of the buried doped layer 22 belong to N type and is a N type buried layer (hereinafter NBL).

According to the present invention, as shown in FIG. 2, the first diode module 12 comprises a first diode and a second diode. In details, the first diode comprises: a first well region 101, a first heavily doped region 201 and a second heavily doped region 202, wherein the first well region 101 disposed on the doped substrate 10 belongs to a first conductivity type, the first heavily doped region 201 disposed in the first well region 101 belongs to the first conductivity type and the second heavily doped region 202 disposed in the first well region 101 belongs to a second conductivity type.

The second diode which is located between the first diode and the lateral clamping structure 20 comprises: a second well region 102, a third heavily doped region 203 and a fourth heavily doped region 204. The second well region 102 disposed on the doped substrate 10 belongs to the second conductivity type, the third heavily doped region 203 disposed in the second well region 102 belongs to the first conductivity type, and the fourth heavily doped region 204 disposed in the second well region 102 belongs to the second conductivity type, wherein the second heavily doped region 202 of the first diode and the third heavily doped region 203 of the second diode are coupled to a first input/output terminal I/O 1 in common for inputting and outputting signals.

Similarly, the second diode module 14 on the opposite side comprises a third diode and a fourth diode. In details, the third diode comprises: a third well region 103, a fifth heavily doped region 205, and a sixth heavily doped region 206. The third well region 103 disposed on the doped substrate 10 belongs to the first conductivity type, the fifth heavily doped region 205 disposed in the third well region 103 belongs to the first conductivity type, and the sixth heavily doped region 206 disposed in the third well region 103 belongs to the second conductivity type.

The fourth diode which is located between the third diode and the lateral clamping structure 20 comprises: a fourth well region 104, a seventh heavily doped region 207 and an eighth heavily doped region 208. The fourth well region 104 disposed on the doped substrate 10 belongs to the second conductivity type, the seventh heavily doped region 207 disposed in the fourth well region 104 belongs to the first conductivity type, and the eighth heavily doped region 208 disposed in the fourth well region 104 belongs to the second conductivity type, wherein the sixth heavily doped region 206 of the third diode and the seventh heavily doped region 207 of the fourth diode are coupled to a second input/output terminal I/O 2 in common for inputting and outputting signals. The first heavily doped region 201 of the first diode is coupled to the fifth heavily doped region 205 of the third diode, and the fourth heavily doped region 204 of the second diode is coupled to the eighth heavily doped region 208 of the fourth diode.

Figure 4:
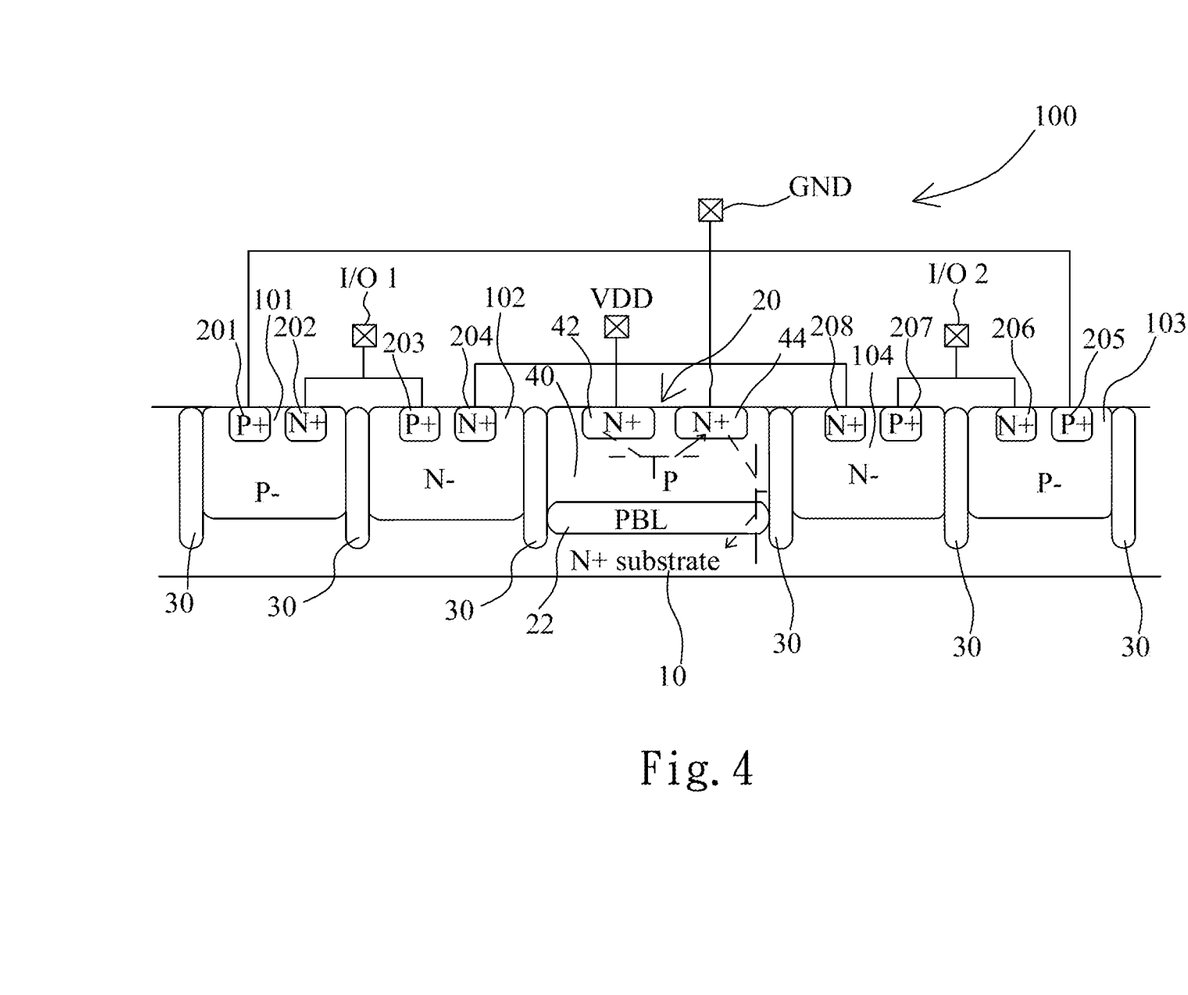
FIG. 4 shows a detailed illustration of the embodiment shown in FIG. 2.

FIG. 4 shows a detailed illustration of the embodiment shown in FIG. 2, in which the first conductivity type is P type, and the second conductivity type is N type. As such, in FIG. 4, each of the first well region 101 and the third well region 103 is a P well region, and each of the second well region 102 and the fourth well region 104 is a N well region. The first heavily doped region 201, the third heavily doped region 203, the fifth heavily doped region 205 and the seventh heavily doped region 207 are P+ region. The second heavily doped region 202, the fourth heavily doped region 204, the sixth heavily doped region 206 and the eighth heavily doped region 208 are N+ region.

The trenches 30 are arranged in the doped substrate 10, having a depth not less than that of the buried doped layer 22, and being disposed between the lateral clamping structure 20 and the first diode, the second diode, the third diode and the fourth diode for electrical isolation.

According to the embodiment of the present invention, the lateral clamping structure 20 is a lateral bipolar transistor circuit. In other embodiments, the lateral clamping structure can be alternatively other clamping circuit for example, silicon controlled rectifier, which will be discussed later. The lateral clamping structure 20 in FIG. 4 is a lateral bipolar transistor circuit, which comprises a first N+ region 42, a second N+ region 44 and a P well region 40, wherein the first N+ region 42 is coupled to a high voltage level VDD, and the second N+ region 44 is coupled to ground GND. The buried doped layer 22 is disposed between the doped substrate 10 and the P well region 40 of the lateral bipolar transistor circuit for isolation. Under such arrangements, the buried doped layer 22 (i.e. the P type buried layer, PBL) is used to reduce beta gain of parasitic vertical NPN. Moreover, since the lateral bipolar transistor circuit (N+/P/N+) in which its base is floating, the floating base lateral NPN has high beta gain, where the dynamic resistance can be effectively reduced. Furthermore, the clamping voltage thereof can be reduced as well due to the small dynamic resistance.

Figure 5:
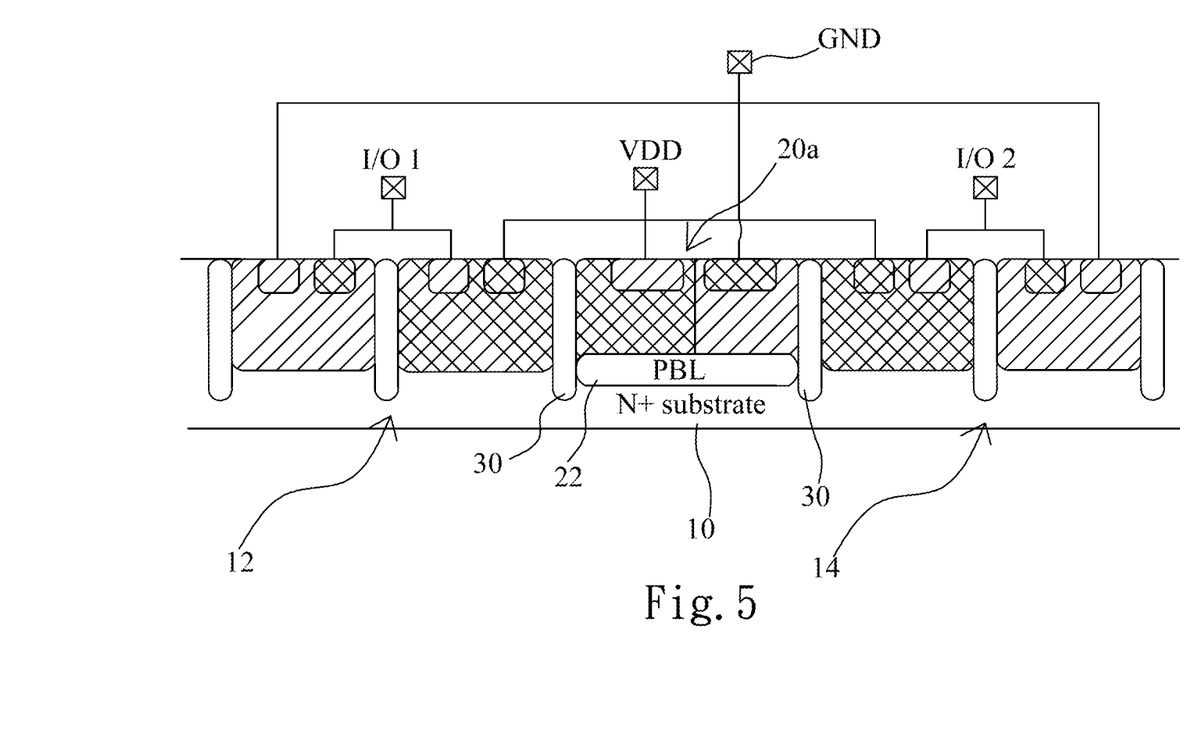
FIG. 5 shows a block diagram of a lateral transient voltage suppressor device in accordance with a third embodiment of the present invention.
Figure 6:
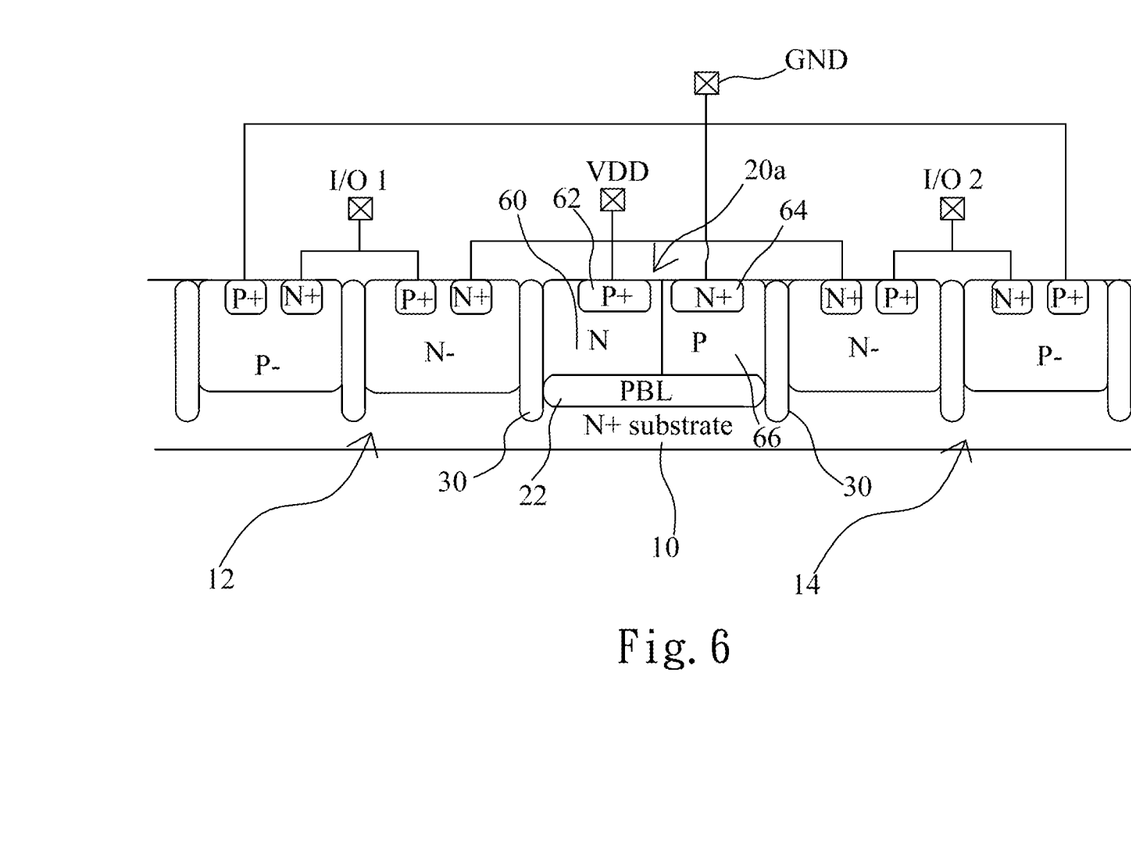
FIG. 6 shows a detailed illustration of the embodiment shown in FIG. 5.

As mentioned earlier, the lateral clamping structure of the present invention is not limited thereto, but can be alternatively other clamping circuit, for example, a lateral silicon controlled rectifier as well. The embodiment is shown in FIG. 5, in which the lateral clamping structure 20a is a lateral silicon controlled rectifier instead. FIG. 6 shows a detailed illustration of the embodiment shown in FIG. 5, in which the lateral clamping structure 20a comprises a first P+ region 62, a second N+ region 64, a N well region 60 and a P well region 66, wherein the first P+ region 62 is disposed in the N well region 60 and coupled to a high voltage level VDD, and the second N+ region 64 is disposed in the P well region 66 and coupled to ground GND. The buried doped layer 22 is disposed between the doped substrate 10 and the N well region 60 and the P well region 66 of the lateral silicon controlled rectifier for isolation. FIG. along with FIG. 6 show a third embodiment of the present invention, wherein the lateral clamping structure is a lateral silicon controlled rectifier circuit alternatively. According to other embodiments of the present invention, the lateral clamping structure can also be other clamping circuit. Those skilled in the art are allowed to make various modifications and variations to the present invention without departing from the scope or spirit of the invention, and yet still falling in the scope of the present invention.

Figure 7:
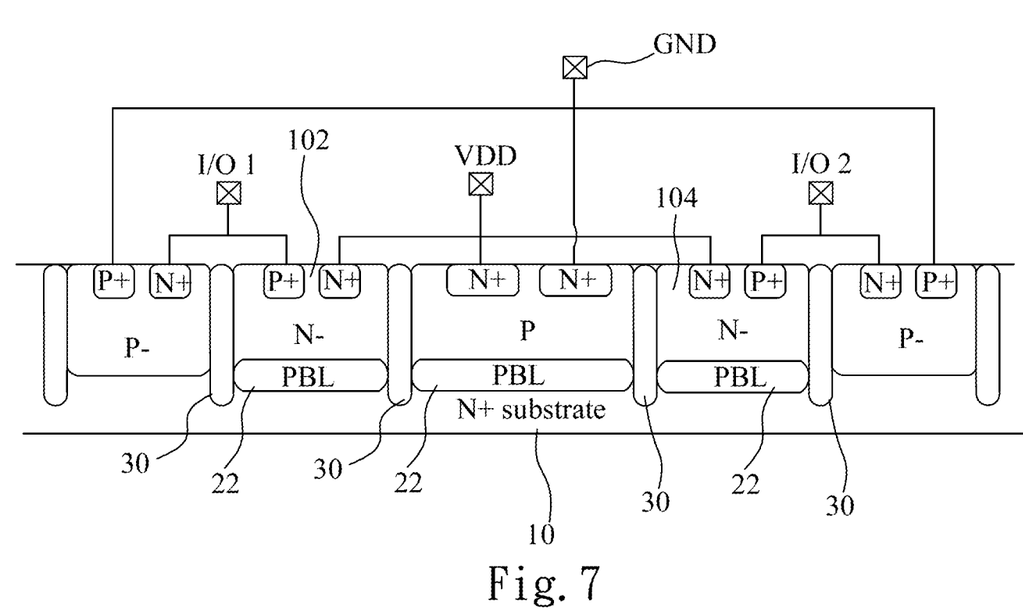
FIG. 7 shows a detailed illustration of a lateral transient voltage suppressor device in accordance with a fourth embodiment of the present invention.
Figure 8:
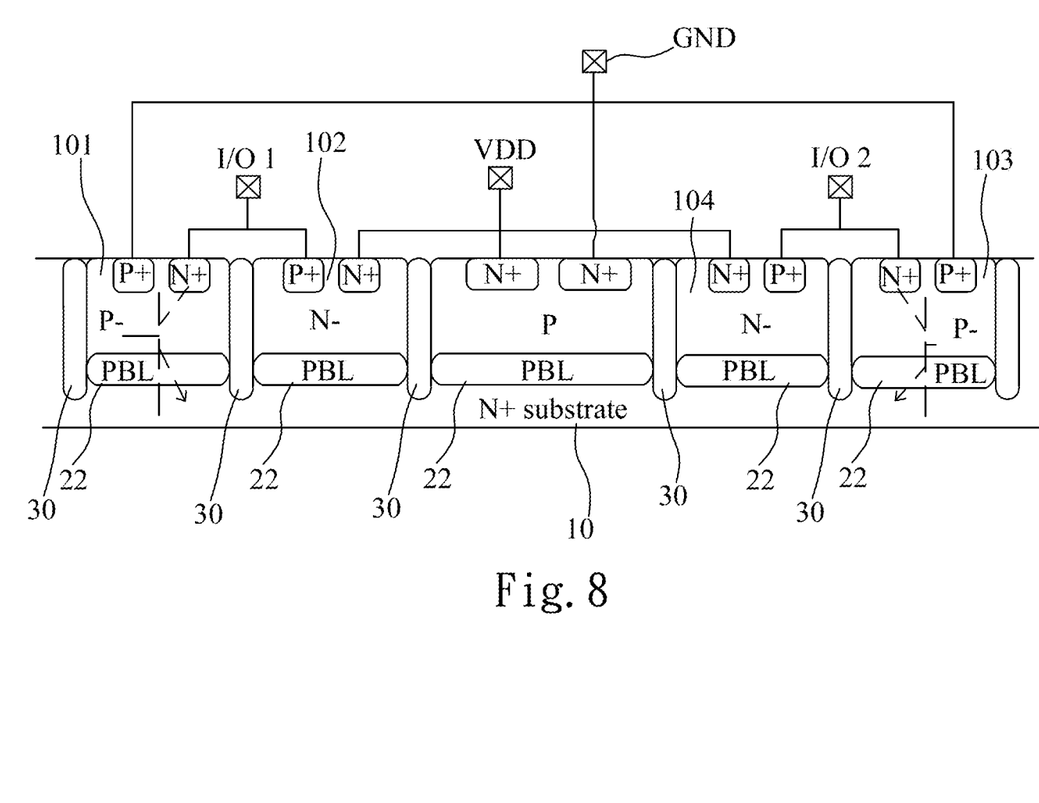
FIG. 8 shows a detailed illustration of a lateral transient voltage suppressor device in accordance with a fifth embodiment of the present invention.

Furthermore, in order to enhance the efficiency of the lateral transient voltage suppressor device of the present invention, the buried doped layer 22 can be further disposed below the first well region 101 of the first diode, the second well region 102 of the second diode, the third well region 103 of the third diode, and/or the fourth well region 104 of the fourth diode additionally. In other words, the buried doped layer 22 may further be disposed below at least one of the first well region 101, the second well region 102, the third well region 103 and the fourth well region 104 so as to isolate at least one of the above from the doped substrate 10. FIG. 7 and FIG. 8 show a fourth embodiment and a fifth embodiment of the present invention, respectively. As shown in FIG. 7, the buried doped layer 22 is further disposed below the second well region 102 and the fourth well region 104. In the fourth embodiment, the buried doped layer 22 is used to separate the N well regions (i.e. the second well region 102 and the fourth well region 104) from the N+ substrate, such that the doped substrate 10 can be electrically floating.

FIG. 8 show a fifth embodiment of the present invention, in which the buried doped layer 22 is further disposed below the first well region 101 of the first diode, the second well region 102 of the second diode, the third well region 103 of the third diode, and the fourth well region 104 of the fourth diode at the same time. In such an embodiment, the buried doped layer 22 is used to further reduce beta gain of parasitic vertical NPN in the first diode and the third diode.

Moreover, the arrangements of the buried doped layer 22 with respect to FIG. 7 and FIG. 8 can also be applied to FIG. 6 as well. The only difference is that the lateral clamping structure can be replaced by the lateral silicon controlled rectifier circuit or any other clamping circuits, which still falls in the scope of the present invention.

Figure 9:
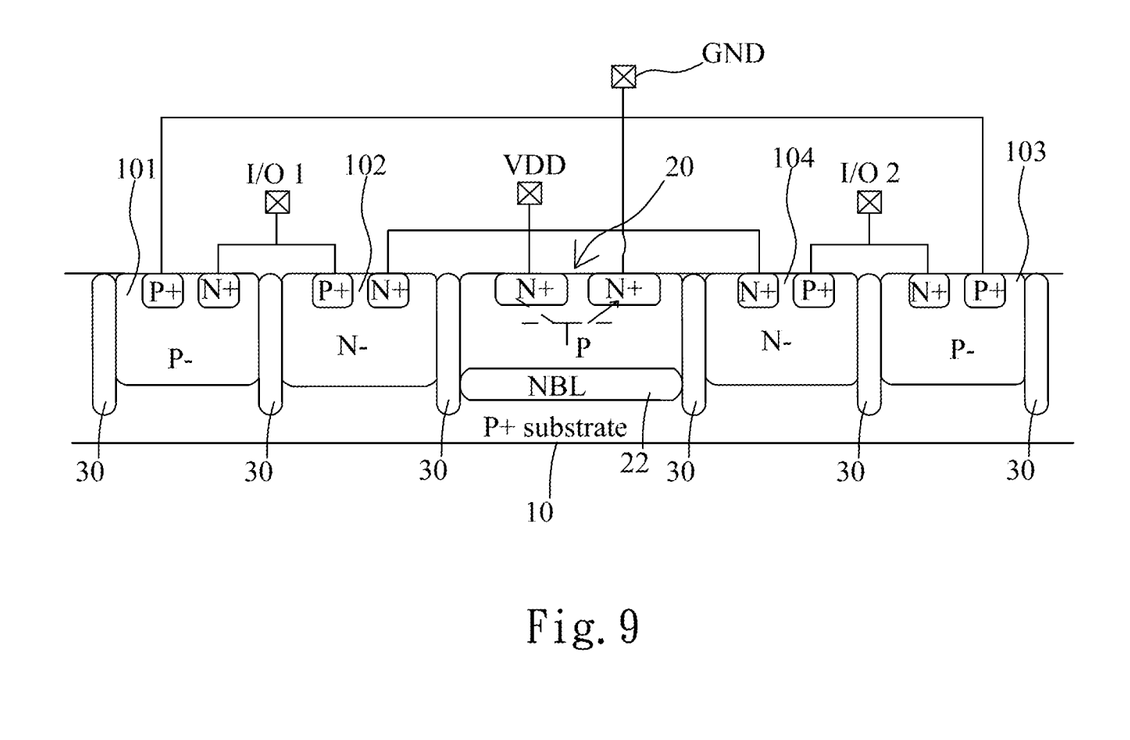
FIG. 9 shows a detailed illustration of the embodiment shown in FIG. 3.

In another aspect, FIG. 9 shows a detailed illustration of FIG. 3 indicating the second embodiment of the present invention. Compared to the embodiment in FIG. 4, the doped substrate 10 in FIG. 9 is replaced by a P+ substrate, and the buried doped layer 22 is replaced by a N type buried layer (hereinafter NBL) while the rest is the same. From this point of view, it is obvious that the doped substrate 10 and the buried doped layer 22 must belong to opposite conductivity types so as to reach the objectives of the present invention.

Figure 10:
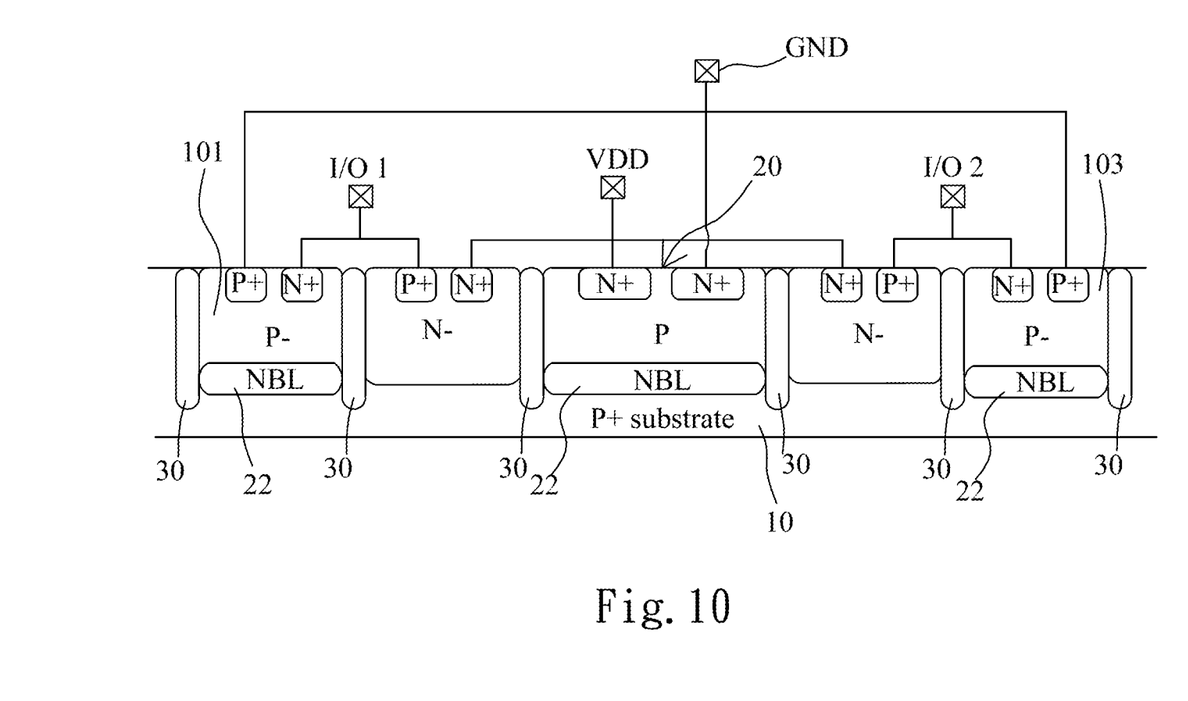
FIG. 10 shows a detailed illustration of a lateral transient voltage suppressor device in accordance with a sixth embodiment of the present invention.
Figure 11:
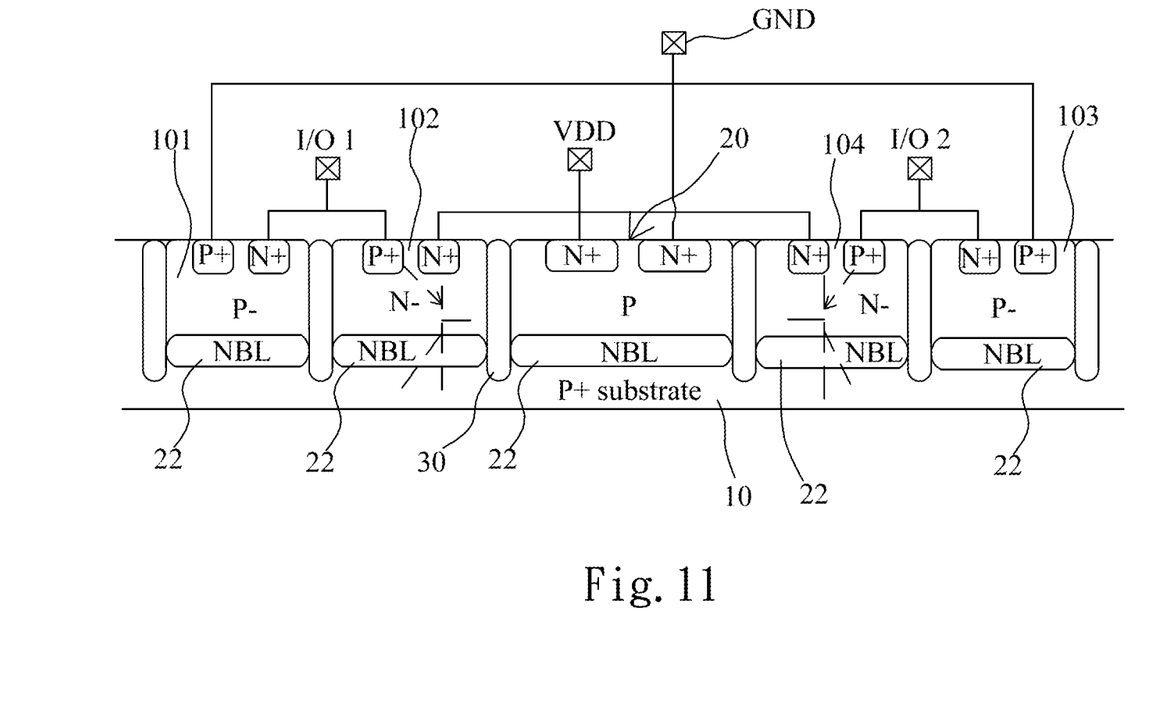
FIG. 11 shows a detailed illustration of a lateral transient voltage suppressor device in accordance with a seventh embodiment of the present invention.

In the same manners, FIG. 10 and FIG. 11 show a sixth embodiment and an seventh embodiment of the present invention, respectively. In addition to the buried doped layer 22 being disposed between the doped substrate 10 and the lateral clamping circuit 20, the buried doped layer 22 can be further disposed below the first well region 101 and the third well region 103 to separate the first well region 101 and the third well region 103 from the doped substrate 10 as shown in FIG. 10. As such, the buried doped layer 22 is used to separate the P well regions (i.e. the first well region 101 and the third well region 103) from the P+ substrate, such that the doped substrate 10 can be electrically floating.

Moreover, FIG. 11 shows an seventh embodiment of the present invention, in which the buried doped layer 22 is further disposed below the first well region 101 of the first diode, the second well region 102 of the second diode, the third well region 103 of the third diode, and the fourth well region 104 of the fourth diode at the same time. In such an embodiment, the buried doped layer 22 is used to further reduce beta gain of parasitic vertical PNP in the second diode and the fourth diode.

As a result, it is believed that besides separating the lateral clamping structure from the doped substrate, the buried doped layer 22 of the present invention may further be disposed below at least one of the first well region 101, the second well region 102, the third well region 103 and/or the fourth well region 104 so as to isolate at least one of the above from the doped substrate 10. The variations and modifications can be made by people skilled in the art based on individual needs, nevertheless, without departing from the scope of the invention.

Figure 12:
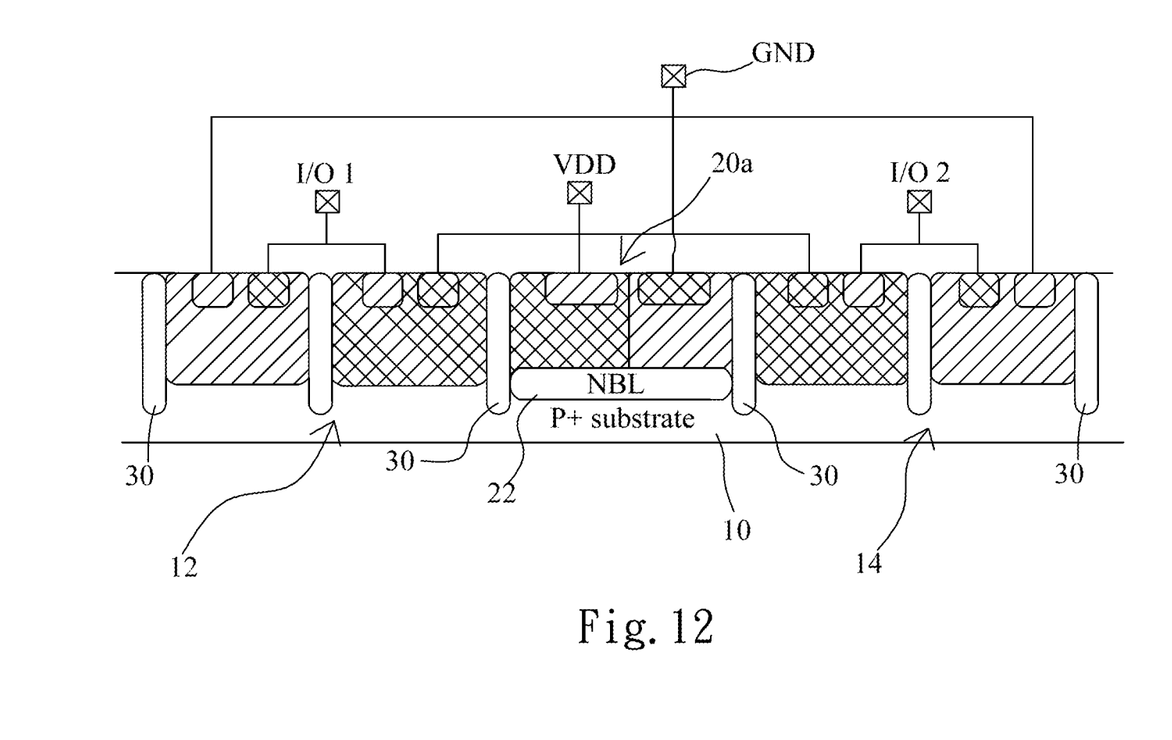
FIG. 12 shows a block diagram of a lateral transient voltage suppressor device in accordance with an eighth embodiment of the present invention.
Figure 13:
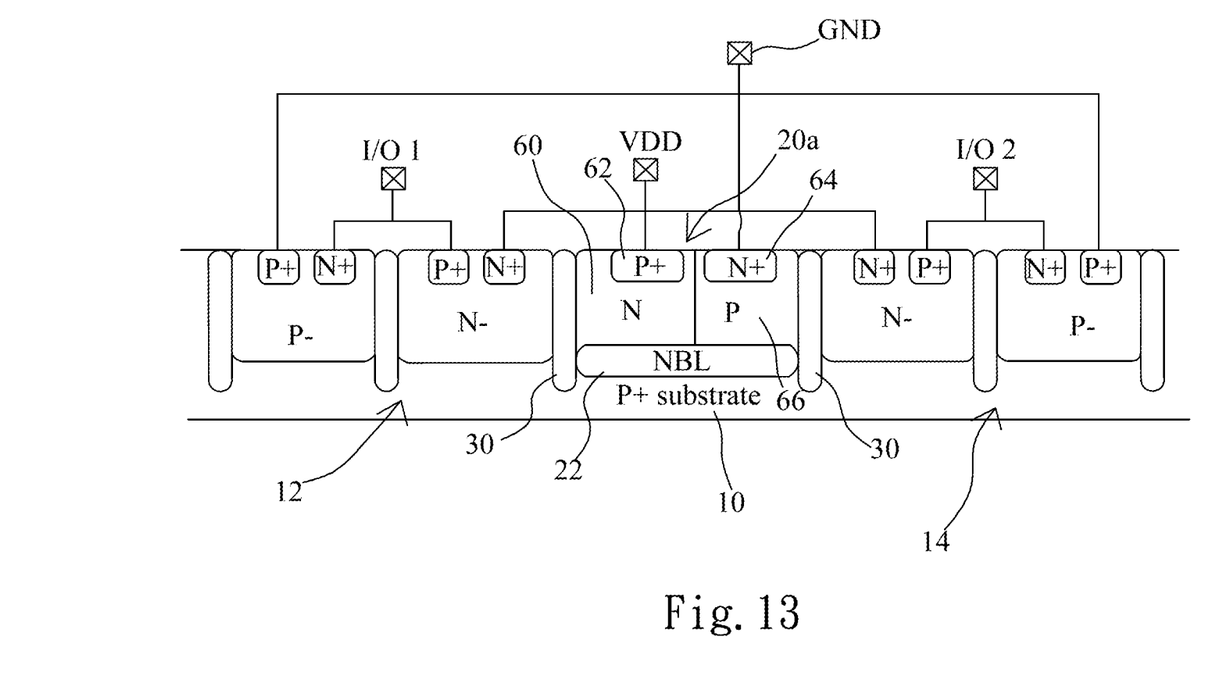
FIG. 13 shows a detailed illustration of the embodiment shown in FIG. 12.

Furthermore, FIG. 12 shows an eighth embodiment of the present invention, in which the lateral clamping structure 20a is a lateral silicon controlled rectifier instead. FIG. 13 shows a detailed illustration of the embodiment shown in FIG. 12, in which the lateral clamping structure 20a comprises a first P+ region 62, a second N+ region 64, a N well region 60 and a P well region 66. The detailed descriptions have already been introduced in the previous embodiments, so will not be repeated again. The difference between the eighth embodiment and the third embodiment (shown as FIG. 5 and FIG. 6) is that the doped substrate 10 is replaced by a P+ substrate, and the buried doped layer 22 is replaced by a N type buried layer (i.e. NBL) while the rest remains the same. Similarly, the arrangements of the buried doped layer 22 with respect to FIG. 10 and FIG. 11 can also be applied to FIG. 13 as well. The only difference is that the lateral clamping structure can be replaced by the lateral silicon controlled rectifier circuit or any other clamping circuits, which still falls in the scope of the present invention.

On account above, it is believed that the present invention has provided a plurality of embodiments (from FIG. 2 to FIG. 13) to fully describe the technical contents, characteristics, and benefits of the present invention. As compared to the prior designs, it is apparent that the proposed lateral transient voltage suppressor device is advantageous of both small dynamic resistance and low clamping voltage. Moreover, parasitic PNP and/or NPN can be further suppressed such that the ESD robustness of the present invention can be enhanced. Thus, the Applicants assert that the present invention is instinct, effective and highly competitive for incoming technology, industries and researches developed in the future and shall be patentable soon as well.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A lateral transient voltage suppressor device, comprising:
    a doped substrate;
    a lateral clamping structure disposed on the doped substrate;
    a buried doped layer disposed between the doped substrate and the lateral clamping structure for isolation such that the doped substrate is electrically floating, wherein the doped substrate and the buried doped layer have opposite conductivity types;
    at least one diode module which is located at one side of the lateral clamping structure; and
    at least one trench arranged in the doped substrate, having a depth not less than that of the buried doped layer, and being disposed between the lateral clamping structure and the at least one diode module for electrical isolation.

2. The lateral transient voltage suppressor device according to claim 1, wherein the lateral clamping structure is a lateral bipolar transistor circuit.

3. The lateral transient voltage suppressor device according to claim 1, wherein the lateral clamping structure is a lateral silicon controlled rectifier circuit.

4. The lateral transient voltage suppressor device according to claim 1, wherein the at least one diode module comprises a first diode module and the first diode module comprises:
    a first diode, comprising:
        a first well region of a first conductivity type disposed on the doped substrate;
        a first heavily doped region of the first conductivity type disposed in the first well region; and
        a second heavily doped region of a second conductivity type disposed in the first well region; and
    a second diode which is located between the first diode and the lateral clamping structure, comprising:
        a second well region of the second conductivity type disposed on the doped substrate;
        a third heavily doped region of the first conductivity type disposed in the second well region; and
        a fourth heavily doped region of the second conductivity type disposed in the second well region;
    wherein the second heavily doped region and the third heavily doped region are coupled to a first input/output terminal in common.

5. The lateral transient voltage suppressor device according to claim 4, wherein the buried doped layer is further disposed below at least one of the first well region and the second well region so as to isolate at least one of the first well region and the second well region from the doped substrate.

6. The lateral transient voltage suppressor device according to claim 4, wherein the at least one diode module further comprises a second diode module which is located at another side of the lateral clamping structure opposite to the first diode module, and the second diode module comprises:
    a third diode, comprising:
        a third well region of the first conductivity type disposed on the doped substrate;
        a fifth heavily doped region of the first conductivity type disposed in the third well region; and
        a sixth heavily doped region of the second conductivity type disposed in the third well region; and
    a fourth diode which is located between the third diode and the lateral clamping structure, comprising:
        a fourth well region of the second conductivity type disposed on the doped substrate;
        a seventh heavily doped region of the first conductivity type disposed in the fourth well region; and
        an eighth heavily doped region of the second conductivity type disposed in the fourth well region;
    wherein the sixth heavily doped region and the seventh heavily doped region are coupled to a second input/output terminal in common.

7. The lateral transient voltage suppressor device according to claim 6, wherein the buried doped layer is further disposed below at least one of the first well region, the second well region, the third well region and the fourth well region so as to isolate at least one of the first well region, the second well region, the third well region and the fourth well region from the doped substrate.

8. The lateral transient voltage suppressor device according to claim 6, wherein the first heavily doped region is coupled to the fifth heavily doped region, and the fourth heavily doped region is coupled to the eighth heavily doped region.

9. The lateral transient voltage suppressor device according to claim 1, wherein when the doped substrate is a N type substrate, dopants of the buried doped layer belong to P type.

10. The lateral transient voltage suppressor device according to claim 1, wherein when the doped substrate is a P type substrate, dopants of the buried doped layer belong to N type.

\* \* \* \* \*